US012010926B2

(12) United States Patent
Kuo

(10) Patent No.: US 12,010,926 B2
(45) Date of Patent: Jun. 11, 2024

(54) MAGNETIC TUNNEL JUNCTION (MTJ) DEVICE AND MANUFACTURING METHOD THEREOF

(71) Applicant: UNITED MICROELECTRONICS CORP., Hsin-Chu (TW)

(72) Inventor: Chih-Wei Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/138,137

(22) Filed: Apr. 24, 2023

(65) Prior Publication Data

US 2023/0263072 A1 Aug. 17, 2023

Related U.S. Application Data

(62) Division of application No. 16/993,278, filed on Aug. 14, 2020, now Pat. No. 11,672,184.

(51) Int. Cl.
*H10N 50/80* (2023.01)
*H10B 61/00* (2023.01)
*H10N 50/01* (2023.01)

(52) U.S. Cl.
CPC ............ *H10N 50/80* (2023.02); *H10B 61/00* (2023.02); *H10N 50/01* (2023.02)

(58) Field of Classification Search
CPC ................................ H10N 50/80; H01N 50/01
See application file for complete search history.

(56) References Cited

U.S. PATENT DOCUMENTS

| 7,372,118 | B2 | 5/2008 | Asao |  |
|---|---|---|---|---|
| 10,026,890 | B2 | 7/2018 | Kim |  |
| 10,580,968 | B1 | 3/2020 | Yi |  |
| 2001/0001742 | A1 | 5/2001 | Huang |  |
| 2004/0185653 | A1* | 9/2004 | Nagano | H01L 28/55 |
|  |  |  |  | 257/E21.648 |
| 2007/0116887 | A1* | 5/2007 | Faguet | C23C 16/515 |
|  |  |  |  | 700/121 |
| 2020/0006641 | A1 | 1/2020 | Liou |  |
| 2021/0083090 | A1 | 3/2021 | Wang |  |

* cited by examiner

*Primary Examiner* — Errol V Fernandes
(74) *Attorney, Agent, or Firm* — Winston Hsu

(57) ABSTRACT

A method of manufacturing a magnetic tunnel junction (MTJ) device, including steps of forming a dielectric layer comprising a metal line therein on a substrate, forming a magnetic tunneling junction element over the metal line, depositing a silicon nitride cap layer conformally covering the magnetic tunneling junction element and the dielectric layer, depositing a tantalum containing cap layer conformally covering the silicon nitride cap layer, removing parts of the tantalum containing cap layer and the silicon nitride cap layer, and disposing a metal plug directly on the magnetic tunneling junction element.

12 Claims, 5 Drawing Sheets ered embodiment that is illustrated in the various figures
MAGNETIC TUNNEL JUNCTION (MTJ) DEVICE AND MANUFACTURING METHOD THEREOF

CROSS REFERENCE TO RELATED APPLICATIONS

This application is a division of U.S. application Ser. No. 16/993,278, filed on Aug. 14, 2020. The content of the application is incorporated herein by reference.

BACKGROUND OF THE INVENTION

1. Field of the Invention

The present invention relates generally to a magnetic tunnel junction (MTJ) device and manufacturing method thereof, and more specifically to a magnetic tunnel junction (MTJ) device applying dual spacers and manufacturing method thereof.

2. Description of the Prior Art

Magnetoresistive random access memory (MRAM) is a type of memory device containing an array of MRAM cells that store data using resistance values instead of electronic charges. Each MRAM cell includes a magnetic tunnel junction (MTJ) unit whose resistance can be adjusted to represent a logic state "0" or "1."

Conventionally, the magnetic tunnel junction (MTJ) unit is comprised of a fixed magnetic layer, a free magnetic layer, and a tunnel layer disposed therebetween. The resistance of the magnetic tunnel junction (MTJ) unit can be adjusted by changing a direction of a magnetic moment of the free magnetic layer with respect to that of the fixed magnetic layer. When the magnetic moment of the free magnetic layer is parallel to that of the fixed magnetic layer, the resistance of the magnetic tunnel junction (MTJ) unit is low, whereas when the magnetic moment of the free magnetic layer is anti-parallel to that of the fixed magnetic layer, the resistance of the magnetic tunnel junction (MTJ) unit is high. The magnetic tunnel junction (MTJ) unit is coupled between top and bottom electrodes, and an electric current flowing through the magnetic tunnel junction (MTJ) from one electrode to another can be detected to determine the resistance, and therefore the logic state of the magnetic tunnel junction (MTJ).

SUMMARY OF THE INVENTION

The present invention provides a magnetic tunnel junction (MTJ) device and manufacturing method thereof, which inserts tantalum containing spacers besides silicon nitride spacers to avoid short circuits.

The present invention provides a magnetic tunnel junction (MTJ) device including at least one magnetic tunnel junction element, silicon nitride spacers and tantalum containing spacers. The magnetic tunnel junction element is disposed on a dielectric layer, wherein a corresponding metal line is disposed in the dielectric layer contacting to the magnetic tunnel junction element. The silicon nitride spacers are disposed on sidewalls of the magnetic tunnel junction element. The tantalum containing spacers are disposed on sidewalls of the silicon nitride spacers, wherein at least one of the tantalum containing spacers includes a top part covering a part of a top surface of the magnetic tunnel junction element.

The present invention provides a method of manufacturing a magnetic tunnel junction (MTJ) device including the following steps. A dielectric layer including a metal line therein is formed on a substrate. A magnetic tunneling junction element is formed over the metal line. A silicon nitride cap layer is deposited to conformally cover the magnetic tunneling junction element and the dielectric layer. A tantalum containing cap layer is deposited to conformally cover the silicon nitride cap layer. Parts of the tantalum containing cap layer and the silicon nitride cap layer are removed. A metal plug is disposed directly on the magnetic tunneling junction element.

According to the above, the present invention provides a magnetic tunnel junction (MTJ) device and manufacturing method thereof, which inserts tantalum containing spacers besides silicon nitride spacers (or a silicon nitride cap), to prevent the silicon nitride spacers (or the silicon nitride cap) from being damaged by etching processes for etching above materials.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-6 schematically depict cross-sectional views of a method of manufacturing a magnetic tunnel junction (MTJ) device according to an embodiment of the present invention.

Figure 1:
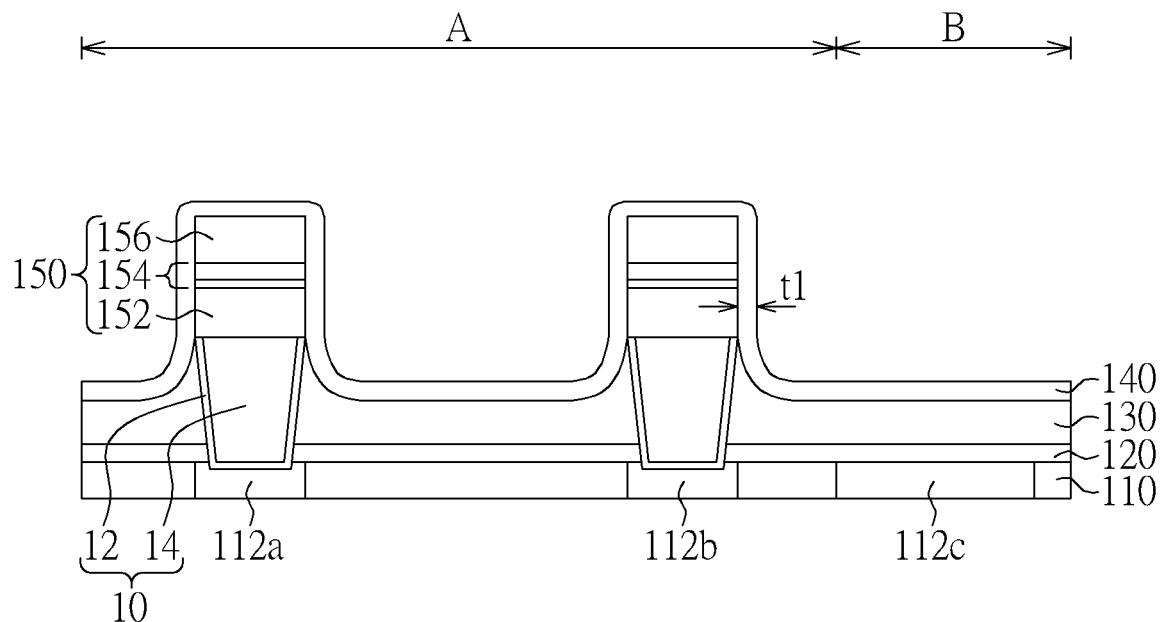
FIG. 1 schematically depicts a cross-sectional view of a method of manufacturing a magnetic tunnel junction (MTJ) device according to an embodiment of the present invention.

As shown in FIG. 1, a dielectric layer 110 is formed on a substrate (not shown), wherein the dielectric layer 110 may be an oxide layer, which may be an inter-metal dielectric layer, but it is not limited thereto. The dielectric layer 110 is depicted in a magnetoresistive random access memory (MRAM) area A and a logic area B in this embodiment, and magnetoresistive random access memory cells are in the magnetoresistive random access memory area A. Furthermore, the dielectric layer 110 may be formed in other not depicted areas such as alignment mark areas etc. A plurality of metal lines 112a/112b/112c are formed in the dielectric layer 110 to connect to above magnetic tunnel junction (MTJ) devices and metal interconnections. The three metal lines 112a/112b/112c are depicted in the diagrams, but the number of the metal lines 112a/112b/112c is not restricted thereto. The metal lines 112a/112b/112c may include copper, and a barrier layer (not shown) may surround each of the metal lines 112a/112b/112c, wherein the barrier layer may be a tantalum nitride layer, but it is not limited thereto.

A cap layer 120 and a first dielectric layer 130 are sequentially formed on the dielectric layer 110, and vias 10 are in the first dielectric layer 130 and the cap layer 120 and connect to the metal lines 112a/112c. The cap layer 120 may be a silicon nitride layer or a carbon containing nitride layer, while the first dielectric layer 130 may be an oxide layer, but it is not limited thereto. Methods of forming the cap layer 120 and the first dielectric layer 130 may include the following steps. A cap layer (not shown) and a first dielectric layer (not shown) may blanketly cover the dielectric layer 110, the cap layer and the first dielectric layer are patterned to form recesses (not shown) in the cap layer 120 and the first dielectric layer 130 and expose the metal lines 112a/112b, and then the vias 10 fill up the recesses, wherein each of the vias 10 may include a barrier layer 12 and a metal 14. Methods of forming the barrier layers 12 and the metals 14 to fill up the recesses may include: forming a barrier layer (not shown) conformally covering the recesses and the first dielectric layer 130, a metal (not shown) filling up the recesses, removing the metal and the barrier layer exceeding from the recesses by a planarization process to form the barrier layers 12 and the metals 14, wherein the barrier layers 12 surround the metals 14. The barrier layers 12 may be titanium layers, titanium nitride layers or titanium/titanium nitride layers, and the metals 14 may be tungsten, but it is not limited thereto.

Magnetic tunnel junction elements 150 are formed over the vias 10. More precisely, a bottom electrode layer (not shown), a magnetic tunneling junction layer (not shown) and a top electrode layer (not shown) are deposited to cover the vias 10 and the first dielectric layer 130. Then, the top electrode layer, the magnetic tunneling junction layer and the bottom electrode layer are patterned to form the magnetic tunnel junction elements 150. Each of the magnetic tunnel junction elements 150 may include a bottom electrode 152, a magnetic tunneling junction 154 and a top electrode 156. The bottom electrode 152 may be a tantalum nitride layer, and the magnetic tunneling junction 154 may include multilayers, which may be composed by an insulating layer sandwiched by two ferromagnetic material layers, called magnetic tunnel junction (MTJ). The resistance of the magnetic tunnel junction (MTJ) unit can be adjusted by changing a direction of a magnetic moment of the free magnetic layer (one of the ferromagnetic material layer) with respect to that of the fixed magnetic layer (the other of the ferromagnetic material layer). When the magnetic moment of the free magnetic layer is parallel to that of the fixed magnetic layer, the resistance of the magnetic tunnel junction (MTJ) unit is low, whereas when the magnetic moment of the free magnetic layer is anti-parallel to that of the fixed magnetic layer, the resistance of the magnetic tunnel junction (MTJ) unit is high. The top electrode 156 may be a metal such as tantalum (Ta), tantalum nitride (TaN), titanium nitride (TiN), tungsten (W), any other suitable material, or a combination thereof.

As shown in FIG. 1, a silicon nitride cap layer 140 is deposited to conformally cover the magnetic tunneling junction elements 150 and the first dielectric layer 130. An etching process (not shown) may be optionally performed to adjust a thickness t1 of the silicon nitride cap layer 140 for controlling a thickness of later formed inner spacers. In this embodiment, the silicon nitride cap layer 140 is composed of silicon nitride, but it is not limited thereto. The silicon nitride cap layer 140 may be formed by a chemical vapor deposition (CVD) process, an atomic layer deposition (ALD) process or etc.

Figure 2:
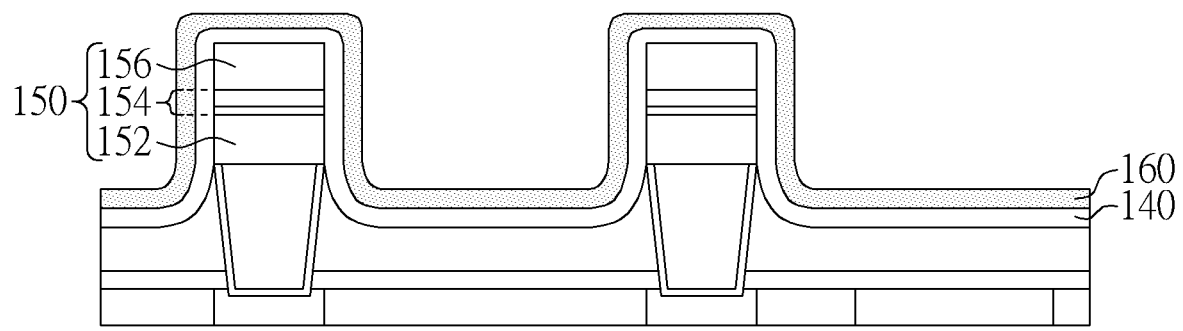
FIG. 2 schematically depicts a cross-sectional view of a method of manufacturing a magnetic tunnel junction (MTJ) device according to an embodiment of the present invention.

As shown in FIG. 2, a tantalum containing cap layer 160 may be deposited to conformally cover the silicon nitride cap layer 140. The tantalum containing cap layer 160 may be composed of tantalum, tantalum nitride or a combination thereof. The tantalum containing cap layer 160 may be formed by a chemical vapor deposition (CVD) process, anatomic layer deposition (ALD) process or etc. Preferably, the tantalum containing cap layer 160 is formed by an atomic layer deposition (ALD) process for forming a thin film.

Figure 3:
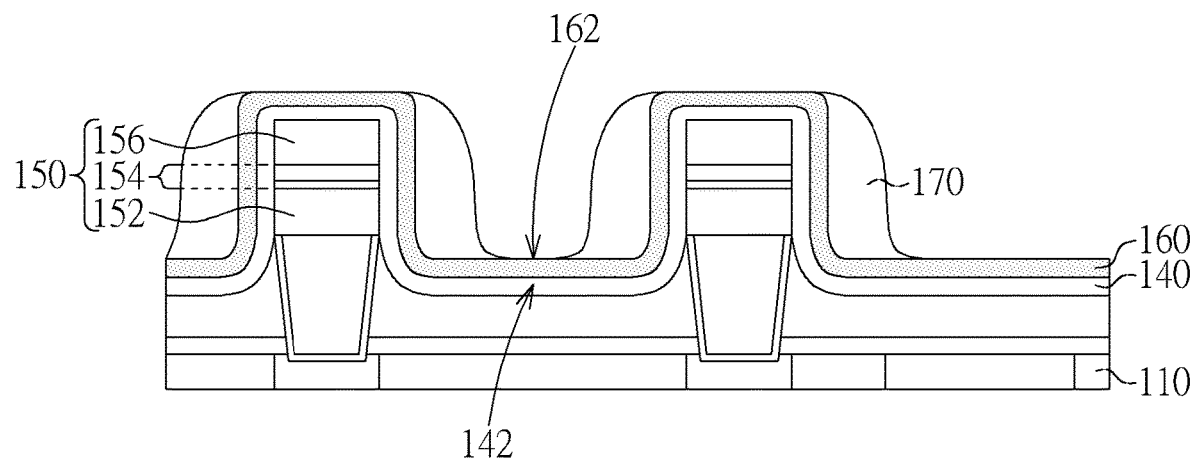
FIG. 3 schematically depicts a cross-sectional view of a method of manufacturing a magnetic tunnel junction (MTJ) device according to an embodiment of the present invention.

As shown in FIG. 3, an oxide layer 170 may be deposited and then etched to cover the tantalum containing cap layer 160 beside the magnetic tunnel junction elements 150. Preferably, the oxide layer 170 is formed by an atomic layer deposition (ALD) process for forming a thin film, but it is not limited thereto.

Figure 4:
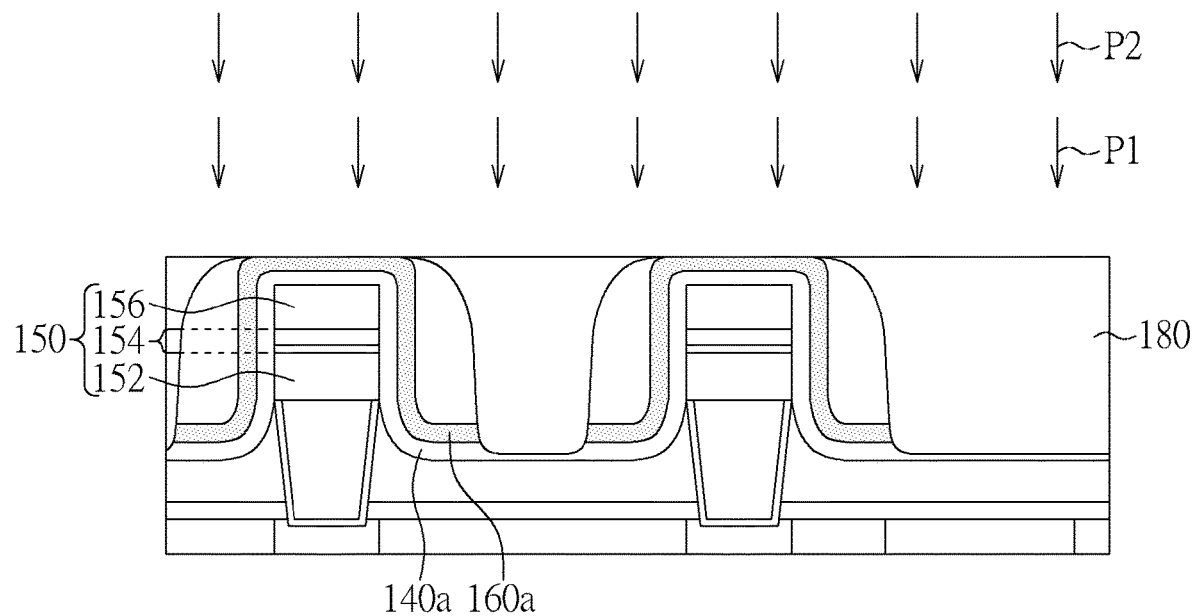
FIG. 4 schematically depicts a cross-sectional view of a method of manufacturing a magnetic tunnel junction (MTJ) device according to an embodiment of the present invention.

As shown in FIGS. 3-4, parts 162 of the tantalum containing cap layer 160 and parts 142 of the silicon nitride cap layer 140 are removed in this embodiment, thereby silicon nitride spacers 140a and tantalum containing spacers 160a being formed on sidewalls of the magnetic tunnel junction elements 150, and a silicon nitride cap layer 140' remaining. Then, a deposition process P1 and then a planarization process P2 may be performed to cover a first dielectric material 180 beside the magnetic tunnel junction elements 150 blanketly. The first dielectric material 180 may be an ultra-low K dielectric layer with a dielectric constant lower than 2.5, and the deposition process P1 may be an ultra-low K deposition process and the planarization process P2 may be an ultra-low K planarization process, but it is not limited thereto. In this embodiment, the first dielectric material 180 is an oxide layer.

Figure 5:
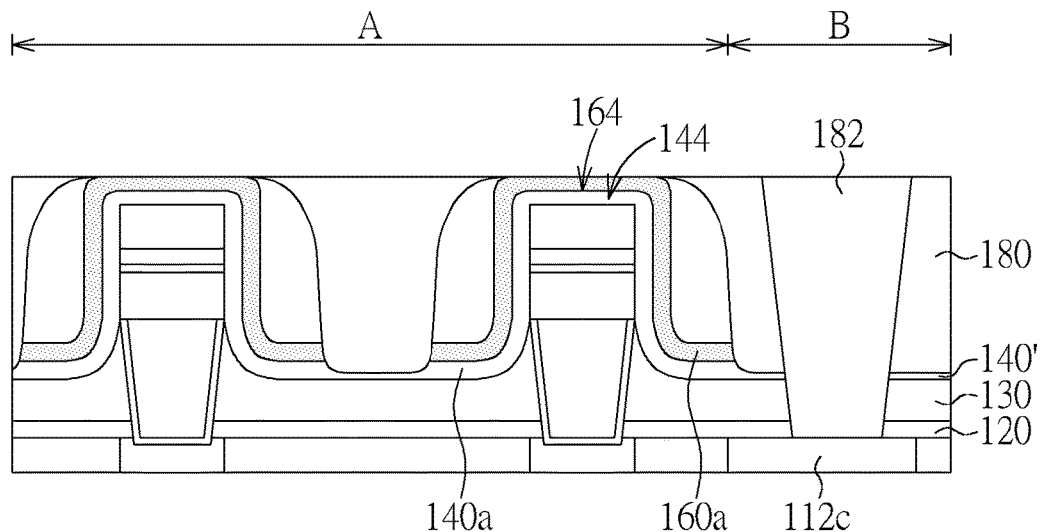
FIG. 5 schematically depicts a cross-sectional view of a method of manufacturing a magnetic tunnel junction (MTJ) device according to an embodiment of the present invention.

As shown in FIG. 5, a first metal plug 182 is formed in the first dielectric material 180 of the logic area B, wherein the first metal plug 182 penetrates through the silicon nitride cap layer 140', the first dielectric layer 130 and the cap layer 120, and directly contacts the metal line 112c.

Figure 6:
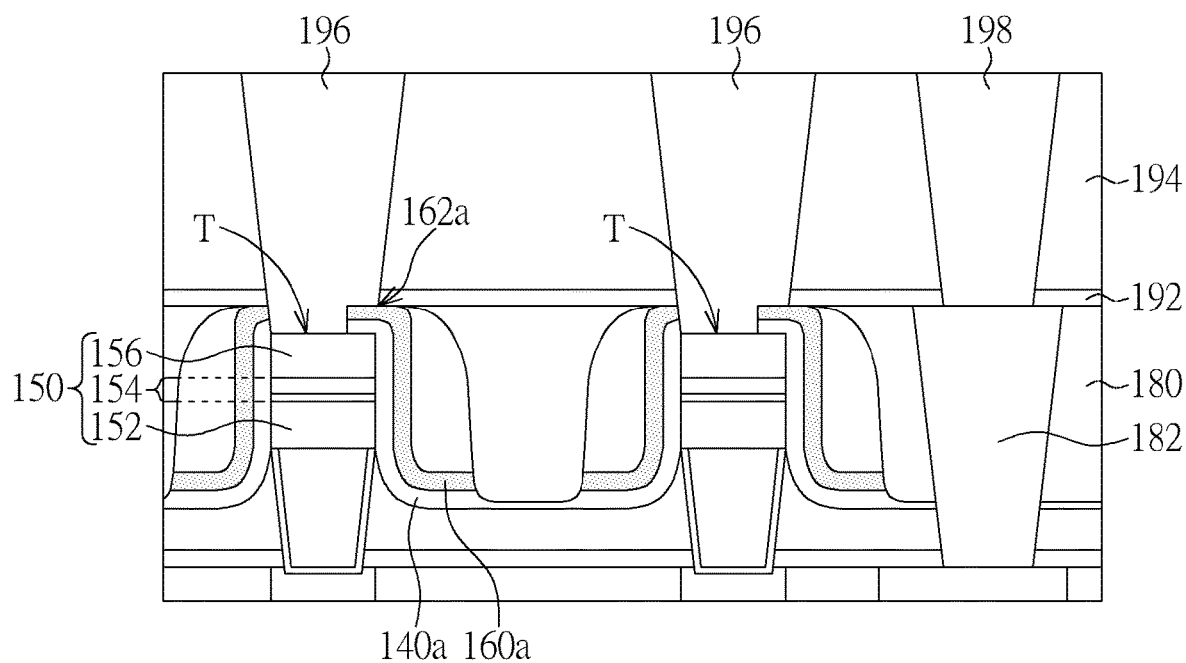
FIG. 6 schematically depicts a cross-sectional view of a method of manufacturing a magnetic tunnel junction (MTJ) device according to an embodiment of the present invention.

As shown in FIG. 6, an optional cap layer 192 and a second dielectric material 194 are deposited on the first dielectric material 180 and the magnetic tunneling junction elements 150. The cap layer 192 may be a silicon nitride layer, and the second dielectric material 194 may be a silicon oxide layer, but it is not limited thereto. Thereafter, the second dielectric material 194 and the optional cap layer 192 are etched to form through holes (not shown) in the second dielectric material 194 and the optional cap layer 192 and expose top surfaces T of the magnetic tunneling junction elements 150, and thus metal plugs 196 and a second metal plug 198 can fill into through holes (not shown) in the second dielectric material 194 and the optional cap layer 192, wherein the metal plugs 196 are directly on the magnetic tunneling junction elements 150 and the second metal plug 198 is directly on the first metal plug 182.

In the present invention, the tantalum containing spacers 160a are inserted beside the silicon nitride spacers 140a. Since the etching rate of the etching process (used for etching the second dielectric material 194 and the optional cap layer 192) to the tantalum containing spacers 160a is lower than the etching rate of the etching process (used for etching the second dielectric material 194 and the optional cap layer 192) to the silicon nitride spacers 140a, the tantalum containing spacers 160a can serve as etch resistance film for preventing the silicon nitride spacers 140a from being damaged by this etching process, and thus avoiding short circuits caused by the physical connection of the magnetic tunneling junction 154 and the metal plugs 196. More precisely, the etching rate of the etching process (used for etching the second dielectric material 194 and the optional cap layer 192 to the tantalum containing spacers 160a) is 1.5 times lower than the etching rate of the etching process (used for etching the second dielectric material 194 and the optional cap layer 192) to the silicon nitride spacers 140a, but it is not restricted thereto.

In this case, the metal plugs 196 and the second metal plug 198 are disposed by etching the second dielectric material 194, to form through holes (not shown) in the second dielectric material 194, and then filling the metal plugs 196 and the second metal plug 198 in the second dielectric material 194. In a preferred embodiment, the metal plugs 196 and the second metal plug 198 are formed by common processes, and are formed at a same time. In a still preferred embodiment, the second dielectric material 194 is etched by a fluorine containing dry etching process. In this embodiment, due to the parts 164 of the tantalum containing spacers 160a and the parts 144 of the silicon nitride spacers 140a being removed by the over-etching of the dry etching process, at least one of the tantalum containing spacers 160a includes top parts 162a covering parts of the top surfaces T of the magnetic tunnel junction elements 150 is reserved. In one case, the tantalum containing spacers 160a are tantalum nitride spacers while the silicon nitride spacers 140a are silicon nitride spacers. Chlorine ($Cl_2$) gas and boron trichloride ($BCl_3$) gas is applied as etching gas of the dry etching process with the processing etching time of 15 seconds to remove the parts 164 of the tantalum containing spacers 160a, and then chlorine ($Cl_2$) gas, boron trichloride ($BCl_3$) gas, nitrogen ($N_2$) gas or argon (Ar) gas is applied as etching gas of the dry etching process with the processing etching time of 30-45 seconds to remove the parts 144 of the silicon nitride spacers 140a. The tantalum containing spacers 160a preferably have a thickness of 50-80 angstroms and the silicon nitride spacers 140a preferably have a thickness of 100-200 angstroms.

Figure 7:
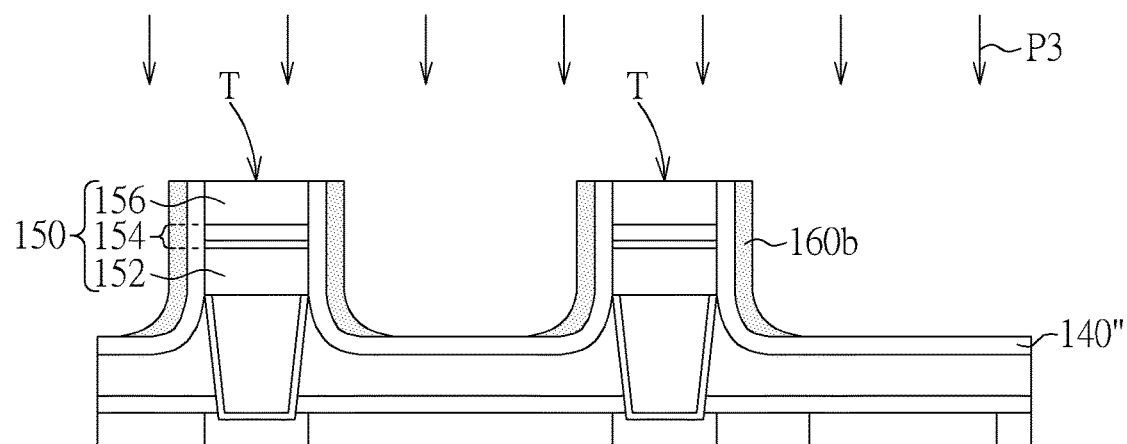
FIG. 7 schematically depicts a cross-sectional view of a method of manufacturing a magnetic tunnel junction (MTJ) device according to another embodiment of the present invention.

In another embodiment, top surfaces of the magnetic tunneling junction elements 150 are exposed by an extra etching process to connect above metal plugs. FIGS. 7-10 schematically depict cross-sectional views of a method of manufacturing a magnetic tunnel junction (MTJ) device according to another embodiment of the present invention. The previous steps of this embodiment are common to the steps of FIGS. 1-2. Then, as shown in FIG. 7, a spacer etching process P3 is performed to form tantalum containing spacers 160b on sidewalls of the magnetic tunnel junction elements 150, and expose top surfaces T of the magnetic tunneling junction elements 150. In this case, only the tantalum containing cap layer 160 is etched to form the tantalum containing spacers 160b but a silicon nitride cap layer 140" is preserved. In another case, not only the tantalum containing cap layer 160 but also the silicon nitride cap layer 140 are etched to form dual spacers, depending upon practical requirements.

Figure 8:
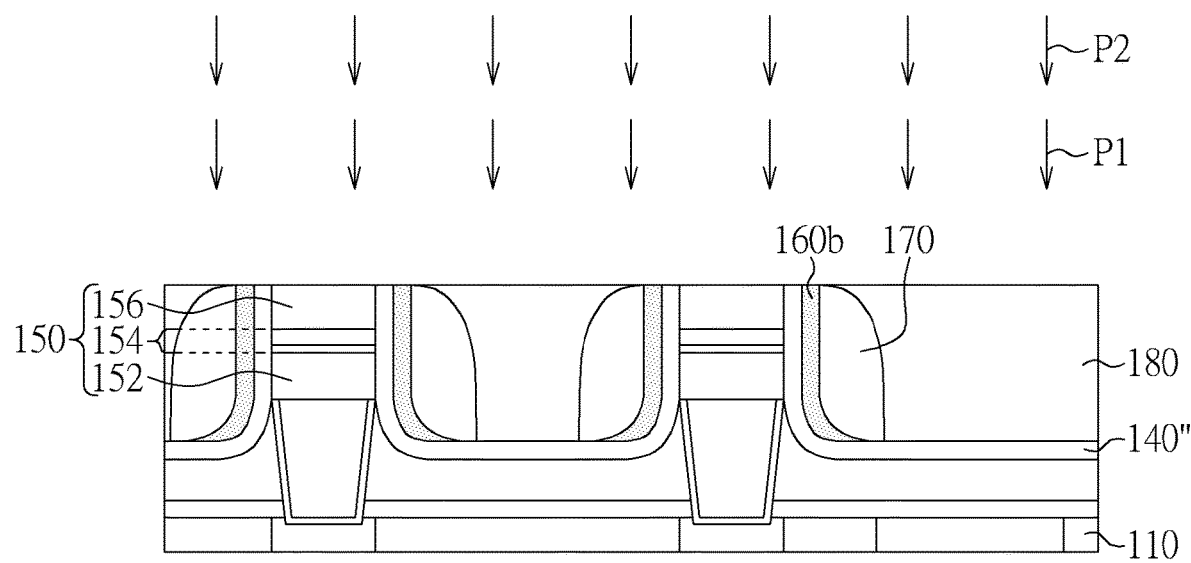
FIG. 8 schematically depicts a cross-sectional view of a method of manufacturing a magnetic tunnel junction (MTJ) device according to another embodiment of the present invention.

As shown in FIG. 8, the oxide layer 170 may be deposited and then etched to cover the tantalum containing spacers 160b and the silicon nitride cap layer 140" beside the magnetic tunnel junction elements 150. Preferably, the oxide layer 170 is formed by an atomic layer deposition (ALD) process for forming a thin film, but it is not limited thereto. Thereafter, the deposition process P1 and then the planarization process P2 may be performed to cover the first dielectric material 180 beside the magnetic tunnel junction elements 150 blanketly. The first dielectric material 180 may be an ultra-low K dielectric layer, and the deposition process P1 may be an ultra-low K deposition process and the planarization process P2 may be an ultra-low K planarization process, but it is not limited thereto. In this embodiment, the first dielectric material 180 is an oxide layer.

Figure 9:
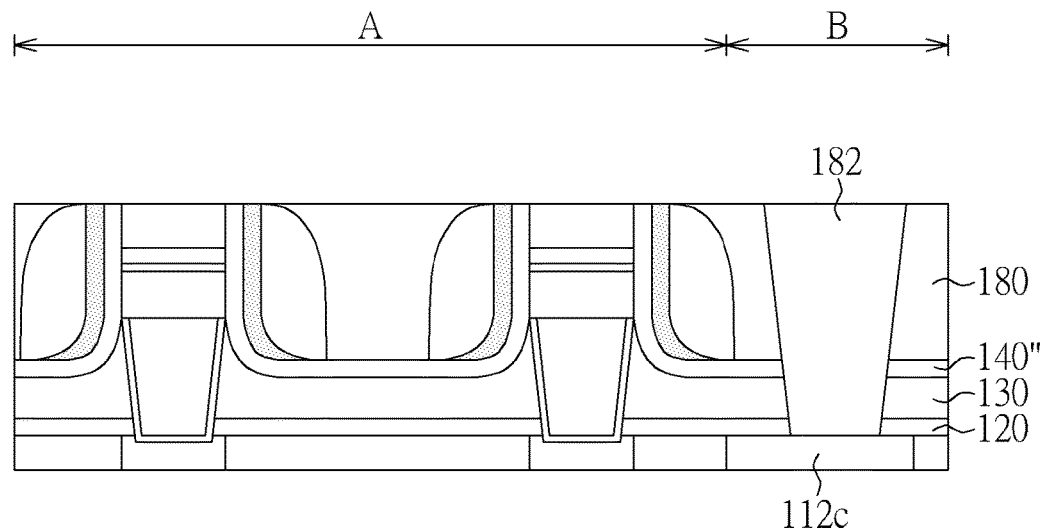
FIG. 9 schematically depicts a cross-sectional view of a method of manufacturing a magnetic tunnel junction (MTJ) device according to another embodiment of the present invention.

As shown in FIG. 9, the first metal plug 182 is formed in the first dielectric material 180 of the logic area B, wherein the first metal plug 182 penetrates through the silicon nitride cap layer 140", the first dielectric layer 130 and the cap layer 120, and directly contacts the metal line 112c.

Figure 10:
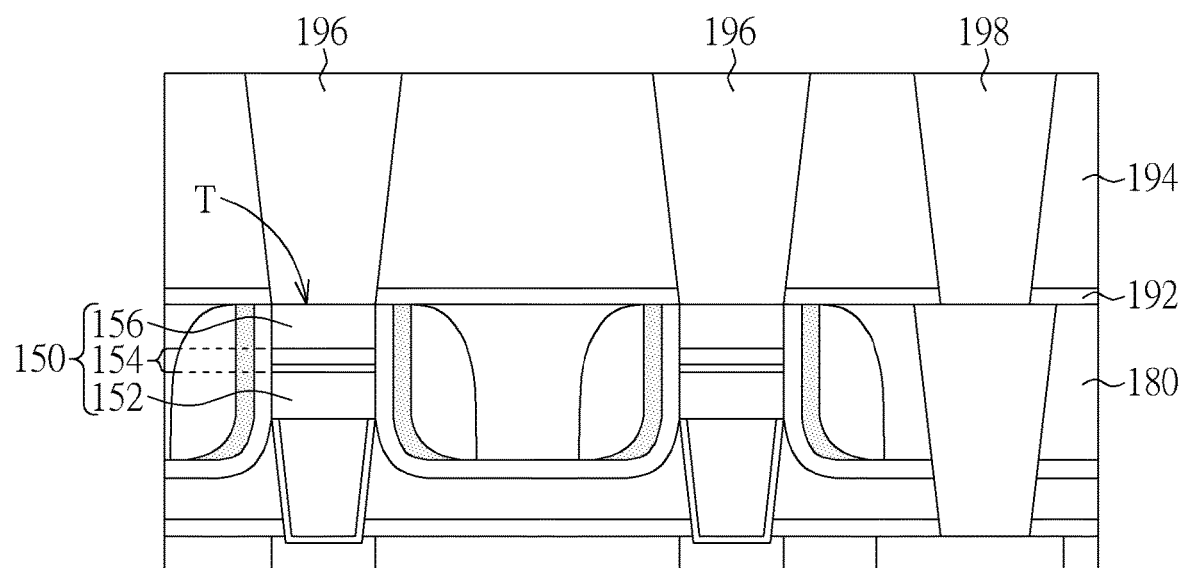
FIG. 10 schematically depicts a cross-sectional view of a method of manufacturing a magnetic tunnel junction (MTJ) device according to another embodiment of the present invention.

As shown in FIG. 10, an optional cap layer 192 and the second dielectric material 194 are deposited on the first dielectric material 180 and the magnetic tunneling junction elements 150. The optional cap layer 192 may be a silicon nitride layer, and the second dielectric material 194 may be a silicon oxide layer, but it is not limited thereto. Thereafter, the second dielectric material 194 and the optional cap layer 192 are etched to form through holes (not shown) in the second dielectric material 194 and the optional cap layer 192 and expose the top surfaces T of the magnetic tunneling junction elements 150, and thus the metal plugs 196 and the second metal plug 198 can fill into through holes (not shown) in the second dielectric material 194 and the optional cap layer 192, wherein the metal plugs 196 directly contact the magnetic tunneling junction elements 150 and the second metal plug 198 directly contacts the first metal plug 182.

In the present invention, the tantalum containing spacers 160b are inserted beside the silicon nitride cap layer 140". Since the etching rate of the etching process (used for etching the second dielectric material 194 and the optional cap layer 192) to the tantalum containing spacers 160b is lower than the etching rate of the etching process (used for etching the second dielectric material 194 and the optional cap layer 192) to the silicon nitride cap layer 140", the tantalum containing spacers 160b can serve as etch resistance film for preventing the silicon nitride cap layer 140" from being damaged by this etching process, and thus avoiding short circuits caused by the physical connection of the magnetic tunneling junctions 154 and the metal plugs 196. More precisely, the etching rate of the etching process (used for etching the second dielectric material 194 and the optional cap layer 192) to the tantalum containing spacers 160b is 1.5 times lower than the etching rate of the etching process (used for etching the second dielectric material 194 and the optional cap layer 192) to the silicon nitride cap layer 140", but it is not restricted thereto.

To summarize, the present invention provides a magnetic tunnel junction (MTJ) device and manufacturing method thereof, which inserts tantalum containing spacers besides silicon nitride spacers (or a silicon nitride cap), to prevent the silicon nitride spacers (or a silicon nitride cap) from being damaged by the etching process for etching above materials. Pars of the tantalum containing cap layer (or the tantalum containing spacers) and the silicon nitride cap layer (or the silicon nitride spacers) on top surfaces of magnetic tunnel junction elements are removed by an extra etching process or by the over-etching of etching above materials for controlling the connection performance of metal plugs contacting the magnetic tunnel junction elements or simplifying processing steps.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a magnetic tunnel junction (MTJ) device, comprising:
    forming a dielectric layer comprising a metal line therein on a substrate;
    forming a magnetic tunneling junction element over the metal line;
    depositing a silicon nitride cap layer conformally covering the magnetic tunneling junction element and the dielectric layer;
    depositing a tantalum containing cap layer conformally covering the silicon nitride cap layer;
    removing parts of the tantalum containing cap layer and the silicon nitride cap layer to form silicon nitride spacers on sidewalls of the magnetic tunnel junction element and tantalum containing spacers on the silicon nitride spacers, wherein the tantalum containing spacers comprises a top part covering parts of a top surface of the magnetic tunnel junction element and a side part covering the sidewalls of the magnetic tunnel junction element, and the silicon nitride spacer is between the tantalum containing spacer and the magnetic tunnel junction element; and
    disposing a metal plug directly on the magnetic tunneling junction element.

2. The method of manufacturing a magnetic tunnel junction (MTJ) device according to claim 1, further comprising:
    performing an atomic layer deposition process to conformally cover an oxide layer on the dielectric layer beside the magnetic tunnel junction element.

3. The method of manufacturing a magnetic tunnel junction (MTJ) device according to claim 1, further comprising:
    performing a deposition process and then a planarization process to cover a first dielectric material beside the magnetic tunnel junction element blanketly.

4. The method of manufacturing a magnetic tunnel junction (MTJ) device according to claim 3, wherein the first dielectric material comprises a MRAM area and a logic area, wherein the magnetic tunneling junction element is in the MRAM area.

5. The method of manufacturing a magnetic tunnel junction (MTJ) device according to claim 4, further comprising:
    forming a first metal plug in the first dielectric material of the logic area.

6. The method of manufacturing a magnetic tunnel junction (MTJ) device according to claim 5, further comprising:
    depositing a second dielectric material on the first dielectric material and the magnetic tunneling junction element.

7. The method of manufacturing a magnetic tunnel junction (MTJ) device according to claim 6, further comprising:
    depositing a metal plug and a second metal plug in the second dielectric material, wherein the metal plug is directly on the magnetic tunneling junction element and a second metal plug is directly on the first metal plug.

8. The method of manufacturing a magnetic tunnel junction (MTJ) device according to claim 7, wherein the metal plug is disposed by etching the second dielectric material, to form a through hole in the second dielectric material, and then filling the metal plug in the second dielectric material.

9. The method of manufacturing a magnetic tunnel junction (MTJ) device according to claim 8, wherein the second dielectric material is etched by a fluorine containing dry etching process.

10. The method of manufacturing a magnetic tunnel junction (MTJ) device according to claim 9, wherein the parts of the tantalum containing cap layer and the silicon nitride cap layer are removed by the over-etching of the dry etching process.

11. The method of manufacturing a magnetic tunnel junction (MTJ) device according to claim 1, wherein the tantalum containing cap layer is deposited by an atomic layer deposition process.

12. The method of manufacturing a magnetic tunnel junction (MTJ) device according to claim 11, wherein the tantalum containing cap layer comprises a tantalum cap layer or a tantalum nitride cap layer.

* * * * *